United States Patent [19]

Abraham et al.

[11] 4,136,765

[45] Jan. 30, 1979

[54] METHODS OF AND APPARATUS FOR ORIENTING ELECTRICALLY ASYMMETRICAL DEVICES WITH MAGNETIC HANDLING

[75] Inventors: Bruce C. Abraham, Reading; Loring D. Emery, Jr., Hamburg; Harold A. Griesemer, Reading; Robert H. Stroup, Fleetwood, all of Pa.

[73] Assignee: Western Electric Company, Inc., New York, N.Y.

[21] Appl. No.: 804,120

[22] Filed: Jun. 6, 1977

[51] Int. Cl.² .......................................... B65G 47/24
[52] U.S. Cl. .................................. 198/381; 198/399; 198/406; 198/690; 198/417; 193/12; 193/46
[58] Field of Search ............... 198/381, 396, 397–399, 198/406, 417, 690, 619; 193/12, 46; 308/10

[56] References Cited

U.S. PATENT DOCUMENTS

| | | | |
|---|---|---|---|
| 946,733 | 11/1910 | Phelps | 198/690 |
| 2,823,781 | 2/1958 | Bosch | 198/381 |
| 2,873,018 | 2/1959 | Dudley et al. | 198/399 |
| 2,940,583 | 6/1960 | Lovercheck | 198/619 |
| 2,975,878 | 3/1961 | Cason | 193/12 |
| 3,115,235 | 12/1963 | Othon | 198/399 |
| 3,253,735 | 5/1966 | Brown et al. | 198/399 |
| 3,731,783 | 5/1973 | Dreher et al. | 198/398 |
| 3,759,367 | 9/1973 | Elliott | 198/690 |
| 3,884,347 | 5/1975 | Gallagher | 198/381 |
| 3,924,211 | 12/1975 | Ioffe et al. | 198/381 |

FOREIGN PATENT DOCUMENTS

| | | | |
|---|---|---|---|
| 622934 | 2/1961 | Italy | 198/417 |
| 493407 | 2/1976 | U.S.S.R. | 198/381 |

*Primary Examiner*—Joseph E. Valenza
*Attorney, Agent, or Firm*—Robert Y. Peters; Donald D. Bosben

[57] ABSTRACT

In making electrically asymmetrical semiconductor devices, it is generally necessary to orient all of the devices into a common polarity at some point in the manufacturing operation. To accomplish this, a magnetic turning chute receives those devices which do not have the desired common polarity and turns them into the common polarity. A helical magnetic field is established in the turning chute by arranging strip magnets into vertical helices around a cylinder. As the devices, which have magnetic properties, progress through the helical field, they are turned by the magnetic force. Further turning impetus is provided by nonmagnetic helical tracks disposed to coincide with the helical magnetic field so that the leads of the devices can slide along the tracks while they move through the chute. Air jets may be used to assist in forcing the devices through the apparatus.

11 Claims, 3 Drawing Figures

METHODS OF AND APPARATUS FOR ORIENTING ELECTRICALLY ASYMMETRICAL DEVICES WITH MAGNETIC HANDLING

BACKGROUND OF THE INVENTION

1. Field of the Invention.

This invention relates generally to methods of and apparatus for orienting devices, and, more particularly, to methods of and apparatus for orienting asymmetrical semiconductor devices by use of a helical magnetic chute.

2. Description of the Prior Art

In the semiconductor industry, many devices, such as diodes, are often electrically asymmetrical. These devices have a different set of electrical characteristics depending on their orientation; when they are oriented in a first direction, they have one polarity and when oriented in a second direction they have an opposite polarity.

Although this electrical asymmetry may also be accompanied by a physical asymmetry of the outer body of a device, it does not necessarily have to be. Thus, it may be impossible to tell the polarity of the device simply by looking at its outer body.

One way to overcome this difficulty is to electrically test the devices and separate them according to their polarities. U.S. Pat. No. 3,731,783 to D. H. Dreher et al. is an example of such a system. This patent is assigned to the assignee of record and is herein incorporated by reference. Once the devices have been separated, it is desirable to orient them all into a common polarity to allow them to be recombined for coding and packaging operations. Generally, the coding operation includes marking an indication of polarity on the devices' outer body.

In recombining the separated devices, a number of techniques have been developed. For example, in systems having separate bins for each polarity, one bin may be turned around so that the devices therein then have the same polarity as the other bin. This, however, requires removal of one of the bins which is time-consuming and cumbersome. Furthermore, since an operator generally does the turning around of the bin, human error may result from a lack of attentiveness.

In other prior art techniques, diodes are automatically oriented after separation. This is accomplished by placing a spirally slotted cylinder in the path of one group of the diodes. The body of each diode stays within the cylinder while the leads extend outwardly through the slots. As the diodes fall through the cylinder, the spiral slot turns the leads so that the devices rotate 180° to the desired polarity. One serious drawback of this system, however, is that the slot must be relatively narrow since the devices could slide out if it were large enough for the bodies of the devices to pass through. Because of the narrowness, the slot will quickly clog up from any dirt buildup from the device. Also, any device misalignment or bends in the leads may cause jamming. Another problem is that no force other than gravity exists to urge the devices into the turning cylinder or to keep them in alignment to avoid clogging.

SUMMARY OF THE INVENTION

It is, therefore, an object of the present invention to provide new and improved methods of and apparatus for orienting a plurality of devices into a common orientation.

Another object of the present invention is to provide new and improved methods of and apparatus for rapidly orienting a plurality of devices into a common orientation by urging them into and turning them along a helical path.

A further object of the present invention is to provide new and improved methods of and apparatus for greatly reducing the likelihood of clogging while orienting a plurality of devices by turning them through a helical path.

With these and other objects in view, the present invention contemplates new methods of and apparatus for positioning each of a plurality of devices having magnetic properties about an axis perpendicular to the longitudinal axes of the devices. The positioning is done by urging each device with a magnetic field arranged to define a helical path to force the devices to turn as they progress through the helical path.

BRIEF DESCRIPTION OF THE DRAWINGS

Other objects and advantages of the present invention may be more clearly understood by reference to the following detailed description and drawings wherein.

DETAILED DESCRIPTION

Helical Magnetic Chute

Figure 1:
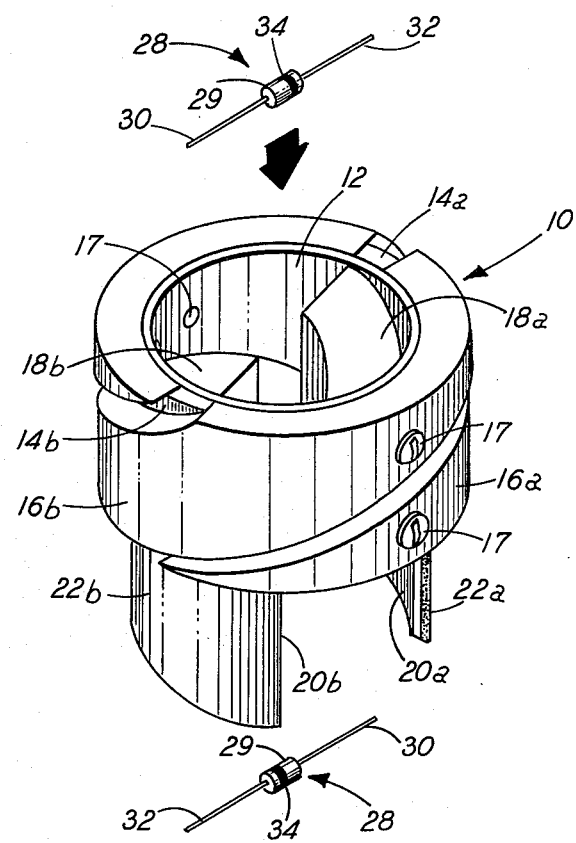
FIG. 1 is a perspective view of the magnetic helical turning chute according to the present invention.
Figure 2:
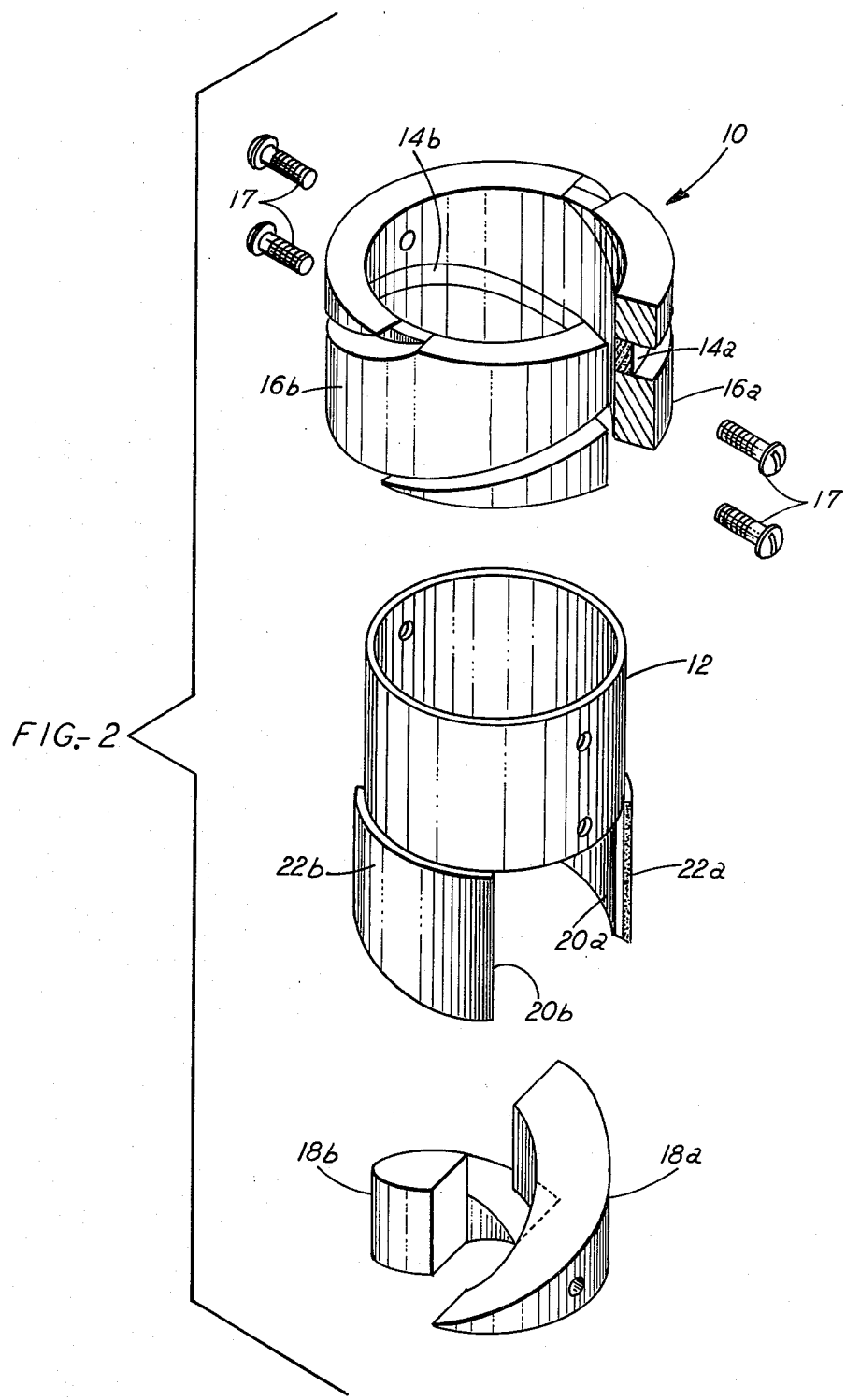
FIG. 2 is an exploded view of FIG. 1 showing the individual elements making up the magnetic helical turning chute.

Referring now to the drawing and, in particular, to FIGS. 1 and 2, a helical magnetic chute, designated generally by the numeral 10, is shown having a nonmagnetic cylinder 12. The cylinder 12 is surrounded by helical magnetic strips 14a and 14b winding diametrically opposite one another along the exterior cylinder wall. The magnetic strips 14a and 14b are magnetized across their thickness to have a pole with a north polarity on one face and a pole with a south polarity on the opposite face. In placing the magnetic strips 14a and 14b around the cylinder 12, one is arranged with its south pole adjacent the cylinder while the other has its north pole adjacent the cylinder. Helical brackets 16a and 16b are also mounted by bolts 17 along the exterior of the cylinder 12 to provide helical slots in which the magnetic strips 14a and 14b are firmly held.

Along the interior of the cylinder 12, nonmagnetic helical tracks 18a and 18b are mounted diametrically opposite one another. The mounting is such that the helical paths along the top of the tracks coincide with the helical plane of the lower edges of the magnetic strips 14a and 14b winding about the cylinder exterior and thus with magnetic paths defined by the strips.

Lower extensions 20a and 20b are mounted on the bottom of cylinder 12 below the magnetic strips 14a and 14b and the helical brackets 16a and 16b. These lower extensions 20a and 20b are surrounded by magnetic sheets 22a and 22b, respectively, with one sheet having its north pole facing inward while the other sheet has its south pole facing inward.

The helical magnetic chute 10 of the present invention may be used to orient magnetic devices that are preferably elongated. For example, the chute 10 may be used to orient an electronic component, such as a semiconductor diode, designated generally by the numeral 28, having a body 29 and opposite ends defined by leads 30 and 32 axially extending from opposite ends of the body 29.

In operation, the diode 28 is placed in proximity with the upper opening of the chute 10 and urged into the chute 10 by gravity, while simultaneously being drawn into the chute by the magnetic field of the strips 14a and 14b.

It should be noted that the total length of the diode 28 must be less than the diameter of the cylinder 12 to allow it to readily fit into the cylinder. For purposes of illustration, a coding stripe 34 is shown on the diode 28, and it is on the right side of the diode located above the chute 10.

Once inside the chute 10, the diode leads 30 and 32 are attracted by the magnetic strips 14a and 14b. One of the leads 30 or 32 is drawn toward the cylinder 12 by one of the strips 14a or 14b while the other lead continues to be attracted by the other strip which has the opposite polarity. As a result, the diode 28 extends perpendicularly to the cylinder wall 12. For the diode 28 to progress or feed through the chute 10, the downward forces on it must be sufficiently greater than the magnetic field created by the magnetic strips 14a and 14b to allow the diode to continue to fall. These downward forces can be provided by gravity, assisted, if desired, by air jets 35 (see FIG. 3) blowing down into the chute 10.

As the diode 28 falls through the chute 10, the magnetic strips 14a and 14b continue to attract the leads 30 and 32 and thus magnetically attract the leads along respective substantially helical paths, causing the diode to turn as it falls. The degree of turning is determined by the angular length of the helices described by the magnetic strips 14a and 14b. Generally, for changing from one polarity to another the diode 28 is turned 180°. This is indicated in FIG. 1 by the coding stripe 34 being on the left side of the exiting diode 28 at the bottom of the chute 10 rather than on the right side as it was at the top.

The helical tracks 18a and 18b assist the magnetic strips 14a and 14b in turning the diode 28. In effect, they provide a restraint by coinciding with the lower edge of the magnetic strips 14a and 14. This prevents a diode 28 from falling straight through the chute 10 without turning if the downward forces on the diode significantly exceed the magnetic forces in the chute 10. If the magnetic forces are weak enough, the diode 28 drops to the lower end of the helical field. The leads 30 and 32 will, respectively, then come into contact with the helical tracks 18a and 18b and slide along them. The body portion of the diode 28 will remain suspended over the hole in the center of chute 10 between the helical tracks 18a and 18b.

Since the tracks 18a and 18b are helical themselves, they also generate a helical turning momentum to the diode 28 by virtue of the sliding of the leads. The actual extent of any turning momentum produced by the helical tracks 18a and 18b depends directly upon the strength of the magnetic field since a very weak field will cause the diode leads 30 and 32 to slide on the tracks all the way through the chute, whereas a very strong field will keep the leads completely above the tracks. Normally, the magnetic field will be chosen to allow a slight contact of the leads 30 and 32 with the helical tracks 18a and 18b so that the turning force on the diode 28 is a combination of the magnetic helix and that of the helical tracks. Such a combination allows a good speed through the chute by balancing the magnetic forces and the downward forces. In this condition some "bouncing" of the leads may occur since the downward striking of the leads on the tracks 18a and 18b may rebound the device off the track slightly. This bouncing, however, has not been found to harm the performance of the chute 10.

Typically, the magnetic strips 14a and 14b are made up of a flexible material impregnated with magnetizable material. However, they may be constructed of solid magnetizable metal or ceramic, or a plurality of small magnets arranged helically around the cylinder 12. Also, although the magnetic strips 14a and 14b are shown as mounted on the outside of the cylinder 12, they could be mounted on the interior if desired or as an integral part of the cylinder wall.

In any case the field strength in the cylinder 12 may be varied by tapering the magnetic strips 14a and 14b at different points. For example, the magnetic strips 14a and 14b could be wider at the top of the cylinder 12 than at the bottom to obtain a decreasing field.

Helical tracks 18a and 18b may be constructed of any nonmagnetic material. An acrylic plastic such as that sold under the trademark "Plexiglas" has been found to be quite satisfactory since it is light, strong and smooth. It should be noted that the helical tracks 18a and 18b may be dispensed with provided the magnetic field generated by magnetic strips 14a and 14b is strong enough to prevent the diodes 28 from falling through the chute 10 without turning. However, use of the helical tracks 18a and 18b in combination with the magnetic field makes the necessary strength of the magnetic field less critical and provides apparatus having speed, reliability and versatility for handling different devices.

The helical tracks 18a and 18b themselves can also act to turn devices without any magnetic field at all, but the operation would be much less efficient since the magnetic field serves to urge devices into the chute 10, produce a turning force on the devices, and hold the devices in alignment perpendicular to the cylinder wall throughout the turning operation. Also, the use of the magnetic field allows the helical tracks 18a and 18b to be designed to have a relatively flat pitch so that the vertical distance between the top and bottom of the tracks is short. This is because the tracks 18a and 18b serve to assist the magnetic strips 14a and 14b, and thus do not need a steep pitch to provide all of the turning momentum themselves.

Although the magnetic strips 14a and 14b and the helical tracks 18a and 18b have been shown as defining a regular helix, this is not necessarily required. On the contrary, it may in certain instances be desirable to have the helix define different degrees of angular slope at different points along its vertical axis. Furthermore, the helical tracks 18a and 18b may extend beyond the top of the cylinder 12. This extension may assist in guiding the diodes properly into the helical path. The extension may be at the same slope or at a different slope from the helical tracks 18a and 18b inside the cylinder 12.

The helical brackets 16a and 16b preferably should also be made of a nonmagnetic material, Plexiglas being a good example. If extreme rigidity is desired, the slots may be filled in behind the magnetic strips 14a and 14b with a potting material. On the other hand, it is possible to eliminate the brackets 16a and 16b entirely by simply bonding the magnetic strips 14a and 14b to the cylinder 12. Similarly, helical tracks 18a and 18b may also be bonded to the cylinder thereby eliminating any need for bolts 17.

To provide a strong core structure for the chute 10, the cylinder 12 is preferably made of stainless steel. However, any other material may be used provided that it is nonmagnetic, or nearly so, and sufficiently strong to mount the magnetic strips 14a and 14b and the helical tracks 18a and 18b.

Throughout this description, the term "magnetic properties" refers to those materials which are capable of being attracted by a magnet. This can include both ferromagnetic and paramagnetic materials.

Transferring and Orienting Devices Between Bins

Figure 3:
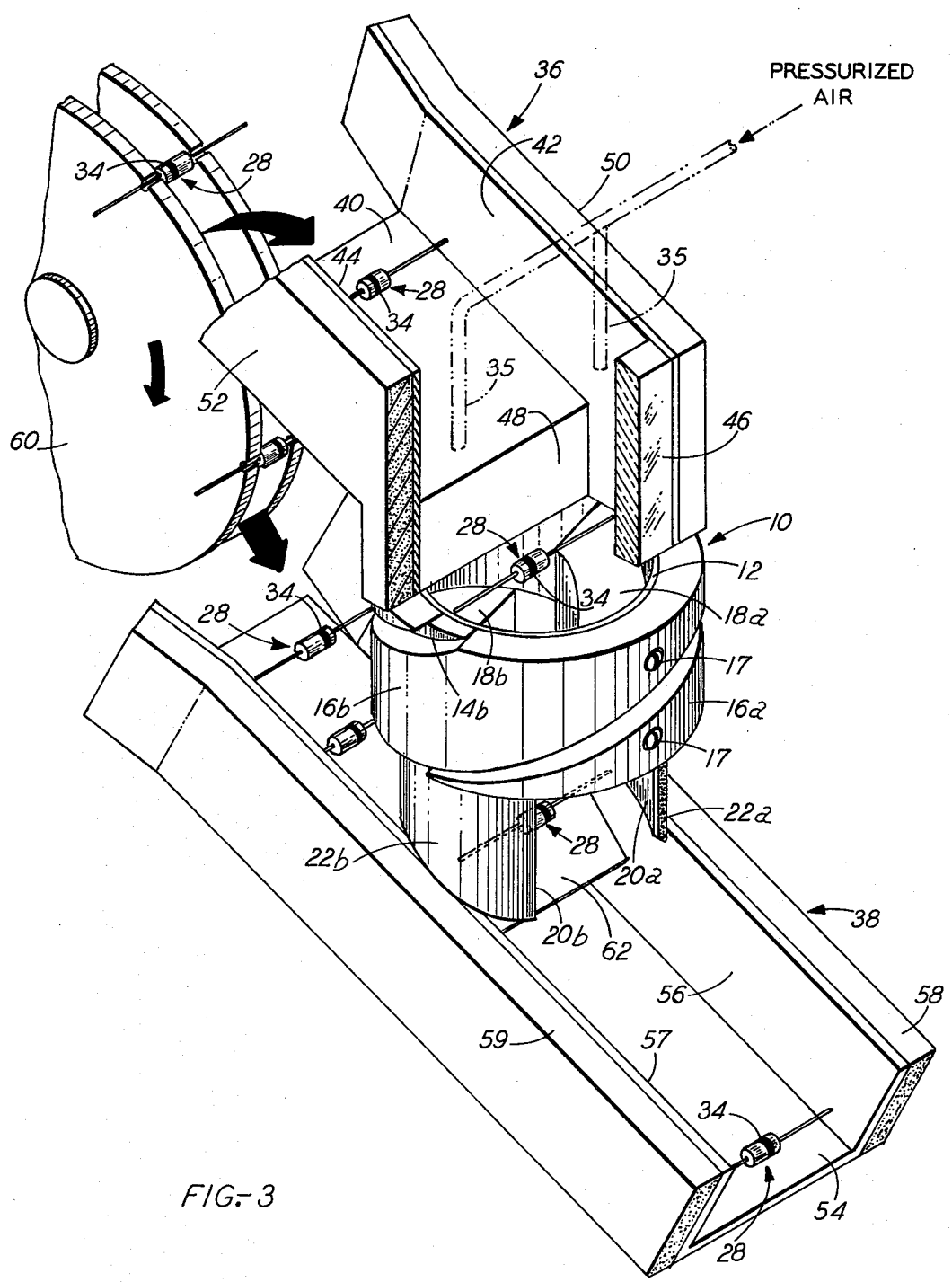
FIG. 3 is a perspective view partially in section, showing the operation of the magnetic helical turning chute in transferring and orienting devices between bins having devices in opposite polarities.

Referring now to FIG. 3, the helical magnetic chute 10 is shown connected between inclined upper and lower bins, designated generally by numerals 36 and 38, respectively. The upper bin 36 has a floor 40, two upright sides 42 and 44, and an end plate 46. Near the end of the incline of the floor 40, a vertical edge 48 intersects the floor to define an opening in the bottom of bin 36 leading to the top of the helical chute 10. Preferably, the bin 36 is also magnetic with magnetic sheets 50 and 52 extending along the outside of sides 42 and 44, respectively.

The magnetic sheets 50 and 52 are arranged so that one will have its north side and the other its south side facing into the bin 36. In a manner similar to the upper bin 36, the lower bin 38 also has a floor 54, two upright sides 56 and 57 and magnetic sheets 58 and 59. However, unlike the upper bin 36, the lower bin 38 is generally open-ended to allow the diodes 28 to proceed to another operation such as coding or packaging.

In a manner similar to that shown in the aforementioned U.S. Pat. No. 3,731,783, a supply wheel 60 provides diodes 28 in two different polarities in notches along its outer circumference. An electrical tester (not shown) determines the polarity of each diode 38 and, based on the polarity, activates an ejector mechanism (not shown) to eject the diodes from the wheel 60 into either the upper bin 36 or lower bin 38. Thus, the upper bin 36 receives all diodes 28 having a first polarity (indicated in FIG. 3 by the coding stripe 34 being on the left of the diode), and the lower bin 38 receives all diodes with the opposite polarity (indicated by the coding stripe being on the right).

Once the diodes 28 are inside the bins 36 and 38, they proceed along them by virtue of the incline of the bins being sufficiently great to allow movement through the magnetic fields. This is discussed in U.S. Pat. No. 3,537,580 to J. E. Beroset et al., which is assigned to the assignee of record and is herein incorporated by reference. The diodes 28 mutually repel one another by virtue of being magnetized and thereby remain separated from and aligned with each other. A typical incline for the bins 36 and 38 to advance the diodes 28 is 15°, although any incline suitable for the particular bins and magnetic fields may be used.

In the upper bin 36 the diodes 28 continue until they reach the vertical edge 48 which they follow until they go through the bottom of the bin into the top of the helical chute 10. At this point, they go through the 180° turning operation of the helical magnetic field, as previously described, and then are deposited into the lower bin 38. A baffle 62 may be provided in the lower bin 38 to help prevent entangling the deposited diodes 28 with those already in the lower bin. The diodes 28 then have the same polarity as those originally ejected into the lower bin 38 from the supply wheel 60, and they may all proceed to any further operations desired.

It is necessary to present a continuous magnetic field to the diodes 28. To do this the various magnetic elements should be arranged so that each of the leads 30 and 32 is subjected to the same magnetic polarity throughout the operation. Thus, if lead 30 is subjected to a field of a north polarity while in the upper bin 36, it should continue to be in a north field through the chute 10 and the lower bin 38. This requires maintaining the same magnetic polarity at the interface of the magnets. For example, if the magnetic sheet 52 has its north side facing inward, then the magnetic strip 14b should also have its north side facing inward since it is adjacent sheet 52. The diode lead near the magnetic strip 14b will continue to be subjected to the north field as it turns through the chute 10. Once the diode reaches the bottom of chute 10, magnetic sheet 58 should have its north field facing inward to continue the north field which the diode lead has been subjected to by magnetic strip 14b.

Although the bins 36 and 38 have been shown to be magnetic diode handling bins, any means, magnetic or otherwise, suitable for transferring devices to the helical chute 10 may be used. Also, the invention may be practiced with any devices which are susceptible to magnetic forces, and is in no way limited to the use of axially leaded diodes. Furthermore, it is possible to use the invention to effect any degree of turning desired. One could provide a helical magnetic chute 10 with devices having different initial orientations being fed in at different points on the helix. For example, it might be desired to turn one group of devices 60°, a second group 120°, and a third group 180°.

It is to be understood that the above-described arrangements are simply illustrative of the application of the principles of this invention. Numerous other arrangements may be readily devised by those skilled in the art which embodies the principles of the invention and fall within its spirit and scope.

What is claimed is:

1. A method of positioning a device having magnetic properties and a longitudinal axis, about an axis perpendicular to the longitudinal axis, which comprises:
    disposing the device in a nonmagnetic cylindrical means having a diameter greater than the length of the device, such that opposite ends of the device are adjacent respective diametrically opposed helical magnetic means of opposite polarity; and
    magnetically attracting the opposite ends of the device along respective substantially helical paths as the device moves through the cylindrical means, to turn the device about the perpendicular axis.

2. A method of orienting a plurality of devices having magnetic properties into a common orientation, comprising:
    supplying the devices in a plurality of orientations, including the common orientation;
    separating the devices which are not in the common orientation from the devices which are in the common orientation;
    magnetically drawing each of the devices which are not in the common orientation into a nonmagnetic cylindrical means having a diameter greater than the length of the device, such that opposite ends of the device are adjacent respective helically shaped, diametrically opposed magnetic means of opposite polarity;

magnetically attracting the opposite ends of the devices which are not in the common orientation along respective substantially helical paths as the devices move through the cylindrical means, to turn the devices into the common orientation; and recombining the turned devices with the devices which were supplied in the common orientation.

3. Apparatus for positioning a device having magnetic properties and a longitudinal axis, about an axis perpendicular to the longitudinal axis, comprising:

nonmagnetic cylindrical means having a diameter greater than the length of the device and through which the device feeds as the device is being positioned; and separate first and second helically shaped magnetic means of opposite polarity disposed diametrically opposite one another on the cylindrical means for magnetically attracting respective opposite ends of the device along substantially helical paths as the device moves through the cylindrical means relative to the magnetic means, so as to turn the device about the perpendicular axis.

4. Apparatus as recited in claim 3, in which the first and second magnetic means are helical strips, and which further comprises:

nonmagnetic means mounted on an exterior surface of the cylindrical means and defining helical slots in which the magnetic strips are mounted.

5. Apparatus as recited in claim 3, which further comprises:

separate first and second substantially helical nonmagnetic tracks disposed in the cylindrical means substantially in coincidence with magnetic paths defined by the first and second helically shaped magnetic means, respectively, the helical tracks being engageable by respective ones of the opposite ends of the device as the device moves through the cylindrical means.

6. Apparatus as recited in claim 3, which further comprises:

opposed magnetic members of opposite polarity extending from an exit end of the cylindrical means for maintaining the device in an oriented position as the device exits from the cylindrical means, each of the magnetic members being of the same polarity as a respective adjacent portion of the first and second magnetic means.

7. Apparatus for orienting a plurality of devices having magnetic properties into a common orientation, comprising:

means for supplying the devices in a plurality of orientations, including the common orientation;

first magnetic bin means for receiving devices which are not in the common orientation from the supplying means;

nonmagnetic cylindrical means having a diameter greater than the length of the devices, for receiving devices which are not in the common orientation from the first magnetic bin means;

separate first and second helically shaped magnetic means of opposite polarity disposed diametrically opposite one another along an exterior surface of the nonmagnetic cylindrical means for magnetically drawing the devices which are not in the common orientation from the first magnetic bin means into the cylindrical means, and for magnetically attracting respective opposite ends of the devices along substantially helical paths as the devices move through the cylindrical means relative to the first and second magnetic means, so as to turn the devices into the common orientation; and second magnetic bin means for receiving devices which are in the common orientation from the supplying means, and for receiving the devices which have been turned into the common orientation from the nonmagnetic cylindrical means;

the first and second magnetic bin means having opposed sidewalls of opposite magnetic polarity, with the polarity of each sidewall being of the same polarity as a respective adjacent portion of the first and second magnetic means to facilitate feeding of the devices into and out of the cylindrical means.

8. Apparatus as recited in claim 7, in which the first and second magnetic means are helical strips, and which further comprises:

nonmagnetic means mounted on the exterior surface of the cylindrical means and defining helical slots in which the magnetic strips are mounted.

9. Apparatus as recited in claim 7, which further comprises:

separate first and second substantially helical nonmagnetic tracks disposed in the cylindrical means substantially in coincidence with magnetic paths defined by the first and second helically shaped magnetic means, respectively, the helical tracks being engageable by respective ones of the opposite ends of the devices as the devices move through the cylindrical means.

10. Apparatus as recited in claim 7, which further comprises:

opposed magnetic members of opposite polarity extending from an exit end of the cylindrical means for maintaining the devices in an oriented position as the devices exit from the cylindrical means into the second magnetic bin means, each of the magnetic members being of the same polarity as a respective adjacent portion of the first and second magnetic means.

11. Apparatus for orienting into a common polarity a plurality of axially leaded electrically asymmetrical devices which have paramagnetic properties and first and second leads extending from opposite ends of the devices, wherein each of the devices has a first set of electrical characteristics when oriented in a first polarity and a second set of electrical characteristics when oriented in a second polarity, comprising:

means for supplying the devices in the first and second polarities;

first magnetic bin means for receiving devices having the first polarity from the supplying means;

second magnetic bin means for receiving devices having the second polarity from the supplying means;

nonmagnetic cylindrical means having a diameter greater than the length of the axially leaded devices for receiving the devices having the first polarity, the first magnetic bin means being located above the cylindrical means for feeding the devices having the first polarity into the cylindrical means and the second magnetic bin means being located below the cylindrical means for receiving the devices from the cylindrical means;

first and second magnetic strips arranged helically along an exterior surface of the nonmagnetic cylindrical means to produce opposing polarity first and second helical magnetic paths diametrically opposite one another within the interior of the cylindrical means, the first and second magnetic bin means having opposed sidewalls of opposite magnetic polarity, with the polarity of each sidewall being of the same polarity as a respective adjacent portion of the first and second magnetic paths produced by the first and second magnetic strips; and first and second vertical helical nonmagnetic tracks mounted diametrically opposite one another on interior walls of the cylindrical means and coinciding with respective ones of the first and second vertical helical magnetic paths produced by the first and second magnetic strips, the devices in the first magnetic bin means being attracted into the cylindrical means by the magnetic strips and the opposite ends of the devices being attracted by respective ones of the magnetic strips as the devices move downward through the cylindrical means, such that the first leads of the devices follow the first vertical helical magnetic path and the coinciding first vertical helical nonmagnetic track and the second leads of the devices follow the second vertical helical magnetic path and the coinciding vertical helical nonmagnetic track.

* * * * *